(12) United States Patent
Gupta et al.

(10) Patent No.: US 7,561,983 B2
(45) Date of Patent: Jul. 14, 2009

(54) TECHNIQUE FOR IMPROVING ION IMPLANTATION BASED ON ION BEAM ANGLE-RELATED INFORMATION

(75) Inventors: Atul Gupta, Beverly, MA (US); Jonathan Gerald England, Horsham (GB)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 517 days.

(21) Appl. No.: 11/537,033

(22) Filed: Sep. 29, 2006

(65) Prior Publication Data

US 2008/0078952 A1    Apr. 3, 2008

(51) Int. Cl.
*G06F 19/00*    (2006.01)

(52) U.S. Cl. .................. 702/134; 702/123

(58) Field of Classification Search ............ 250/492.21; 702/123, 127, 124
See application file for complete search history.

(56) References Cited

U.S. PATENT DOCUMENTS

| | | | |
|---|---|---|---|
| 6,646,277 B2 | 11/2003 | Mack et al. | |
| 6,881,967 B1 | 4/2005 | Ray | |
| 7,507,960 B2 * | 3/2009 | Zani et al. | 250/306 |
| 2004/0191931 A1 | 9/2004 | Murrell et al. | |
| 2006/0208203 A1 | 9/2006 | Gupta et al. | |
| 2006/0208204 A1 | 9/2006 | Gupta et al. | |
| 2006/0219936 A1 * | 10/2006 | Olson et al. | 250/397 |
| 2006/0289798 A1 * | 12/2006 | Cummings et al. | 250/492.21 |
| 2009/0037134 A1 * | 2/2009 | Kulkarni et al. | 702/127 |
| 2009/0043527 A1 * | 2/2009 | Park et al. | 702/123 |

* cited by examiner

*Primary Examiner*—Nikita Wells
*Assistant Examiner*—Johnnie L Smith

(57) ABSTRACT

A technique for improving ion implantation based on ion beam angle-related information is disclosed. In one particular exemplary embodiment, the technique may be realized as a method for improving ion implantation. The method may comprise obtaining angle-related information associated with an ion beam. The method may also comprise calculating, based on the angle-related information, an ion beam angle distribution over a wafer for one or more potential scanning modes. The method may further comprise selecting a desired scanning mode from the one or more potential scanning modes based on an evaluation of performance metric caused by the ion beam angle distribution.

35 Claims, 11 Drawing Sheets

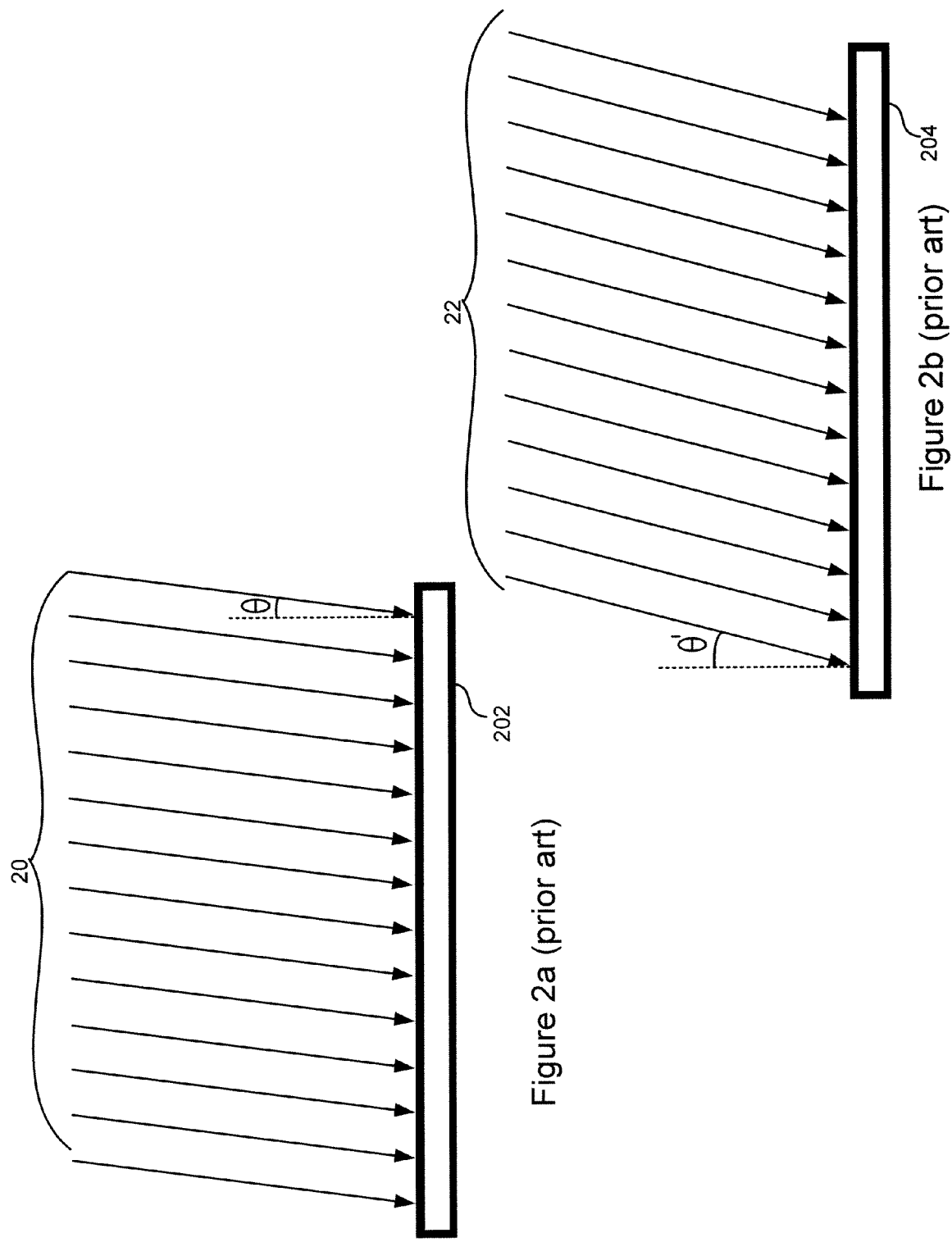

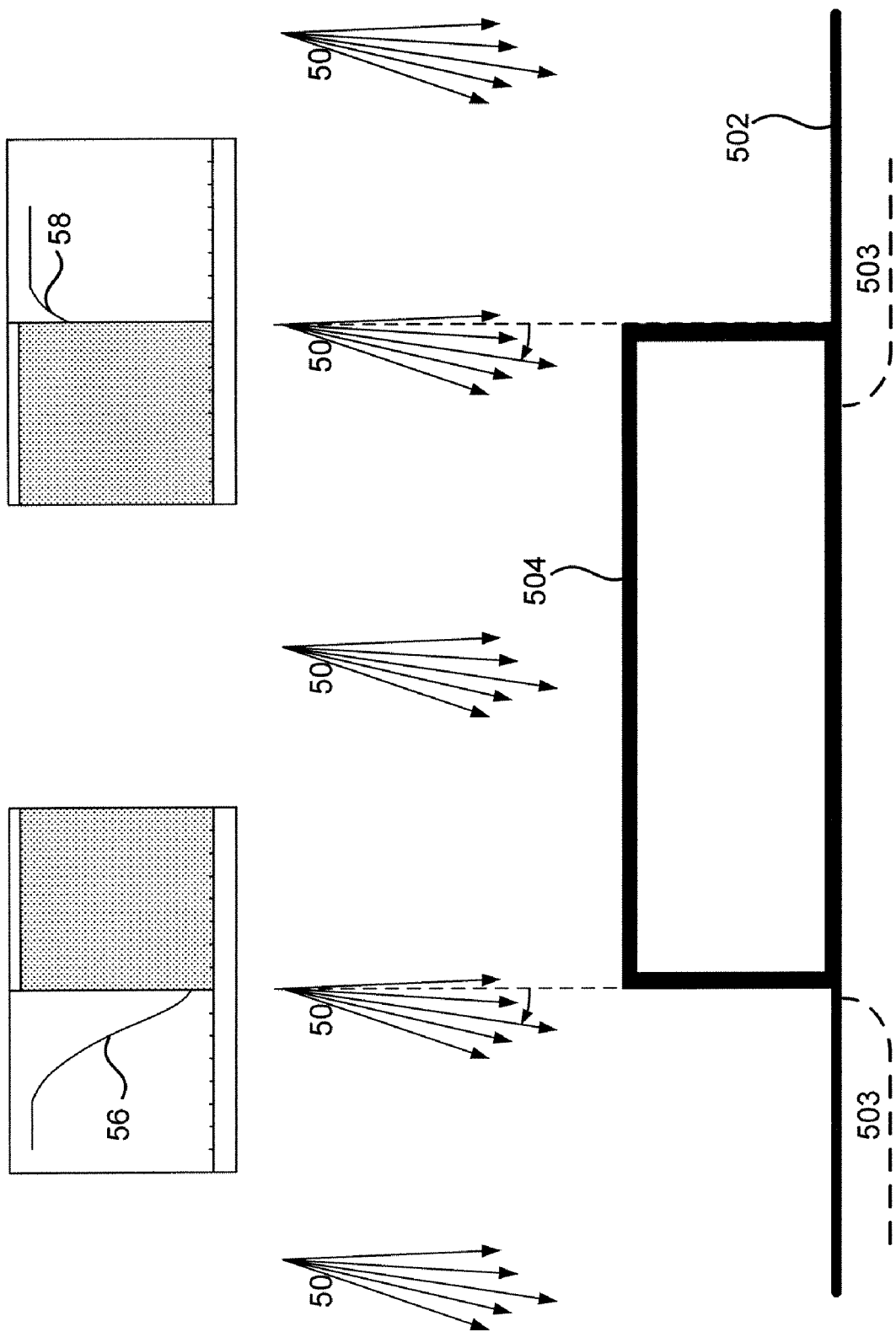

TECHNIQUE FOR IMPROVING ION IMPLANTATION BASED ON ION BEAM ANGLE-RELATED INFORMATION

FIELD OF THE DISCLOSURE

The present disclosure relates generally to ion implantation and, more particularly, to a technique for improving ion implantation based on ion beam angle-related information.

BACKGROUND OF THE DISCLOSURE

Ion implantation is a process of depositing chemical species into a substrate by direct bombardment of the substrate with energized ions. In semiconductor fabrication, ion implanters are used primarily for doping processes that alter the type and level of conductivity of target materials. A precise doping profile in an integrated circuit (IC) substrate is often crucial for proper IC performance. To achieve a desired doping profile, one or more ion species may be implanted in different doses, at different energies and different incident angles.

Traditionally, an ion implant process in semiconductor manufacturing is followed by a thermal annealing step to activate implanted dopant atoms. This thermal annealing step controls the spread of dopant atoms beyond the implanted regions in the substrate and hence controls the transition regions in the devices which are critical for device performance. However, as the devices are scaled down to ever smaller dimensions, the thermal budget available for post-implant processes (e.g., annealing) also has to be scaled down, which results in increased sensitivity of device performance to the implanted dopant profiles. Moreover, the implants are typically done on patterned substrates, and aspect ratios for desired implanted regions have become higher, necessitating ever stringent angle control requirements for ion implanters. It is therefore critical to both characterize the ion beam in terms of angle distributions and the effect of substrate topography on implant performance. As an example, if the ions are to be implanted at the bottom of a high aspect ratio trench, due to the intrinsic spread in beam angles, only a fraction of the nominal implanted dose (for a flat surface) will make it to the bottom of the trench. Any small error in the average incident angle may further exacerbate this problem. Therefore, it may be desirable to factor in the effects of device topography and beam characteristics in order to effectively improve overall device performance and yield.

In production ion implanters, an ion beam is typically of a smaller size than a target wafer, which necessitates scanning of either the ion beam across the target wafer or moving the wafer across the ion beam or a combination thereof. Scanning an ion beam typically refers to the movement of the ion beam to increase wafer area that can be implanted, while scanning a wafer typically refers to the relative movement of a wafer through an ion beam. As used hereinafter, "scanning" refers to the relative movement of an ion beam with respect to a wafer or substrate surface. The ion beam is typically either a "ribbon beam" having a rectangular cross section or a "spot beam" having a circular cross section. In the case of a ribbon beam with a dimension longer than the wafer diameter, ion implantation of the wafer may be achieved by keeping the ribbon beam stationary and simultaneously moving the wafer across the ribbon beam in a direction orthogonal to the longer dimension of the ribbon beam. The one-dimensional (1-D) movement of the wafer may cause the ribbon beam to cover the entire wafer surface. In the case of a spot beam, scanning of a wafer may be achieved by sweeping the spot beam back and forth between two endpoints to form a scan path and by simultaneously moving the wafer across the scan path. Sweeping of the spot beam may be accomplished through the use of electrostatic scanners or magnetic scanners wherein the spot beam is controllably deflected from its normal trajectory to span a larger area by changing the electric or magnetic fields respectively in a direction orthogonal to the direction of travel of the spot beam. The strength of the deflection fields determines the total deflection from the normal path of the spot beam, and hence the spot beam may be scanned by changing the field strength of the scanner elements. Alternatively, the spot beam can remain stationary and the wafer can be translated in two orthogonal directions. This mode of operation is typically referred to as a two-dimensional (2-D) mechanical scan. The movement of the wafer across the scan path may be either continuous or incremental.

Any ion beam in an ion implanter may have a distribution of angles which results from, for example, initial ion extraction angles from an ion source and transport of the ion beam through different beamline elements from the ion source to the wafer plane. The distribution of angles in the ion beam typically has a finite angle spread that is not negligible, i.e., not all the ions in the ion beam cross the wafer plane at the same incident angle. As shown in FIG. 1$a$, a ribbon beam 100 may be considered to comprise a plurality of beamlets 104. These beamlets 104 may have a distribution of angles around a mean direction. Due to beam emittance or divergence, and/or the transport through the beamline elements, these beamlets 104 may strike a wafer surface 102 at different average incident angles. Thus, the wafer surface 102 is exposed to an intrinsic spread of ion beam incident angles. Further, as shown in FIG. 1$b$, each beamlet 104 may also have an intrinsic spread of incident angles due to, for example, space-charge effects. That is, ions that form the beamlet travel in an average direction but spread out according to a Gaussian-like distribution around the average direction. Since these beamlets form a continuum that describes the ribbon beam, each position in the beam envelope may be considered to have a distribution of angles. It is this angle distribution that is incident on any particular region of the wafer during ion implantation. Similarly, a typical spot beam may also have an intrinsic angle spread such that different portions of the spot beam have a particular ion direction. When the beam or the wafer is scanned in one direction, the resulting incident angle distribution at any point on the wafer is the collective distribution comprising of all the angles in the scan direction.

Ion beam incident angles and intrinsic angle spreads may cause angle variations in the ion implantation process. There are typically three types of angle variations, whose causes and effects are illustrated in FIGS. 2-4 respectively.

FIGS. 2$a$ and 2$b$ illustrate wafer-to-wafer (or inter-wafer) angle variations, wherein wafers 202 and 204 are different wafers separately processed based on the same recipe in the same ion implanter system. Due to small differences in the setups of the ion implanter system and/or beam steering errors, the wafer 202 may be implanted with an ion beam 20 incident at a first angle θ, while wafer 204 may be implanted with an ion beam 22 incident at a second angle θ', wherein θ'≠θ. θ and θ' are "angle errors" or "tilt errors" measured with respect to a nominal direction of the wafer surface. In the description that follows, the angle errors are shown as being measured with respect to the normal incidence of the wafer surface. However, in general, such angle errors may be measured with respect to any predetermined angle. The angle errors typically affect all structures or devices on the wafers 202 and 204, and the angle difference can cause wafer-to-wafer variations in device performance. The ion beams 20 and 22 may also have different intrinsic angle spreads which may cause additional doping variations between the two wafers.

FIG. 3 illustrates within-wafer (or intra-wafer) angle variations, wherein different parts of a wafer 302 may experience different ion beam incident angles ($\theta_1$, $\theta_2$, and $\theta_3$, etc.) due to intrinsic angle spread within an ion beam 30. Alternatively, a wafer with an irregular surface (e.g., concave or convex surface) may have significant intra-wafer angle variations even when it is exposed to a perfectly parallel ion beam (i.e., an ion beam with zero angle spread). Such intra-wafer angle variations can cause significant performance variations for devices located in different parts of the same wafer.

FIG. 4 illustrates device-level angle variations. As shown, a first part of an ion beam (40) may have a first average incident angle, and a second part of the ion beam (42) may have a second average incident angle, which may cause a trench 402 or a mesa 404 to see a spread of incident angles. As a result, the bottom of the trench 402 may have a different dopant profile from its sidewalls. And each sidewall of the trench 402 may have a different dopant profile from another. Similarly, the mesa 404 may have one side more heavily doped than an opposite side. For certain applications, such an asymmetrical dopant profile may not be acceptable.

If the ion beam incident angles and/or angle spread are not properly controlled in the implantation and doping processes, the above-described angle variations may cause device performance variations and even yield problems, as illustrated in FIGS. 5a and 5b. FIG. 5a depicts an ion beam 50 with zero angle error and a small angle spread. The ion beam 50 is used to dope a substrate surface 502, a part of which is masked by a structure 504 (e.g., a gate stack) having vertical sidewalls. Since the ion beam 50 is aligned with the sidewalls, the resulting dopant profiles 52 and 54 on either side of the structure 504 are symmetric. Even with the symmetric dopant profiles, effective ion doses in the substrate 504 are not uniform. Due to the shadowing effect from the structure 504, the effective ion doses close to the edges of the structure 504 are lower than areas far away from the edges of the structure 504.

If, however, the ion beam 50 has a small angle error as shown in FIG. 5b, the shadowing effect from the structure 504 can cause the resulting dopant profiles 56 and 58 to be asymmetrical which causes a degradation in the IC performance. In an extreme case as for high aspect ratio structures, the asymmetry in the dose distributions may cause the device to be inoperable. The difference in effective ion doses on either side of the structure 504 is referred to as a "dose skew." The difference in effective ion incident angles on either side of the structure 504 is referred to as an "angle skew." Such dose skews or angle skews may cause asymmetry in physical features of a device as well as in device performance. For example, if the structure 504 is a gate stack of a metal-oxide-semiconductor (MOS) transistor, the source and drain regions 503 on either side of the structure 504 may effectively be shifted due to the angle skew, such that one region may have no overlap with the gate while the other region may have too much overlap with the gate. The performance asymmetry (or performance skew) may be exhibited, for example, in a number of transistor parameters such as contact resistance ($R_c$), series resistance ($R_{sd}$), threshold voltage ($V_t$), overlap capacitance ($C_{ov}$), on current ($I_{d,sat}$), off current ($I_{off}$), and gate leakage ($I_{g,off}$). That is, a transistor originally designed to be symmetric may become lopsided, wherein, if the source and drain contacts are switched, one or more of these transistor parameters may change significantly.

Note that the structure 504 may be just one of the devices one the substrate 502 whose topography makes it sensitive to ion beam angle variations (e.g., beam steering errors and angle spreads). Typical ion implants that are sensitive to angle variations include, but are not limited to, contact plug implants, source-drain extension implants, and halo implants. In addition, different type of structures or devices (with different orientations) may be sensitive to angle variations in different directions. If the angle error and/or angle spread of the ion beam 50 are not properly controlled, similar yet varying effects may be seen across different parts of the substrate 502 or across different wafers. As the device feature size continues to shrink, the device-level, wafer-level, and wafer-to-wafer angle variations, if left uncontrolled, may cause more performance variations and other detrimental effects.

The setup-to-setup variations in ion beam angle distributions may also cause process repeatability problems in an ion implanter system. In extreme cases, the ion beam angle variations may lead to yield losses. As described above, uncontrolled ion beam incident angles and angle spread may cause significant performance variations among different wafers processed in the same implanter. Existing methods for setting up an ion implanter system have typically been limited to the repeatability of implant doses. No known method manages to effectively control or minimize dose skews and/or angle skews over an entire wafer and/or among different wafers.

In view of the foregoing, it would be desirable to provide a technique for improving ion implantation which overcomes the above-described inadequacies and shortcomings.

SUMMARY OF THE DISCLOSURE

A technique for improving ion implantation based on ion beam angle-related information is disclosed. In one particular exemplary embodiment, the technique may be realized as a method for improving ion implantation. The method may comprise obtaining angle-related information associated with an ion beam. The method may also comprise calculating, based on the angle-related information, an ion beam angle distribution over a wafer for one or more potential scanning modes. The method may further comprise selecting a desired scanning mode from the one or more potential scanning modes based on an evaluation of performance metric caused by the ion beam angle distribution.

In accordance with other aspects of this particular exemplary embodiment, the ion beam may be a ribbon beam and at least one of the one or more potential scanning modes may involve translating the wafer across the ribbon beam.

In accordance with further aspects of this particular exemplary embodiment, the ion beam may be a spot beam and at least one of the one or more potential scanning modes may involve sweeping the spot beam in a first direction and translating the wafer in a second direction perpendicular to the first direction. The angle-related information may be obtained by performing a preliminary scan with the spot beam in the first direction and measuring, for each of a plurality of locations along the first direction, a beam angle profile or an ion dose profile associated with the scanned ion beam as seen by that location.

In accordance with additional aspects of this particular exemplary embodiment, the ion beam may be a spot beam and at least one of the one or more potential scanning modes may involve keeping the spot beam stationary and translating the wafer with respect to the stationary spot beam in a two-dimensional pattern.

In accordance with another aspect of this particular exemplary embodiment, at least one of the one or more potential scanning modes may be a two-dimensional mechanical scanning mode having a specified scan pitch between two consecutive passes, and wherein the selection of the desired scanning mode comprises selecting a desired scan pitch.

In accordance with yet another aspect of this particular exemplary embodiment, wherein the plurality of scanning modes may be selected from a group consisting of: a single-step mode involving no rotation of the wafer, a bi-mode involving two rotations of the wafer, and a quad-mode involving four rotations of the wafer.

In accordance with still another aspect of this particular exemplary embodiment, the method may further comprise selecting one or more tilt offsets that, when implemented with the desired scanning mode, produce desired performance metric. Each of the one or more tilt offsets may be implemented in one scan step in the desired scanning mode.

In accordance with a further aspect of this particular exemplary embodiment, the method may further comprise tuning an intrinsic angle distribution associated with the ion beam to produce desired performance metric.

In accordance with yet a further aspect of this particular exemplary embodiment, the evaluation of the performance metric may comprise calculating a merit function based on the ion beam angle distribution. The merit function may be weighted to account for relative importance of different devices or different portions of the wafer.

In accordance with still a further aspect of this particular exemplary embodiment, the performance metric may comprise one or more items selected from a group consisting of: dose skews, angle skews, and skews in any device characteristics associated with a plurality of locations on the wafer. The performance metric may also be based on one or more device specific characteristics or skews therein selected from a group consisting of: contact resistance, series resistance, threshold voltage, overlap capacitance, on current, off current, gate leakage current, or any other device characteristics associated with a plurality of locations on the wafer. And, the performance metric may be calculated based at least in part on device topography associated with a plurality of locations on the wafer.

In accordance with other aspects of this particular exemplary embodiment, the method may further comprise calculating, based on the angle-related information, an effective dose distribution of the ion beam for the one or more potential scanning modes and selecting the desired scanning mode from the one or more potential scanning modes based on an evaluation of dose skews caused by the effective dose distribution.

In accordance with further aspects of this particular exemplary embodiment, the method may further comprise calculating, based on the ion beam angle distribution for the one or more potential scanning modes and a substrate topography, a merit function reflecting at least one of an angle and dose effect in one or more regions of the wafer and selecting a desired scanning mode from the one or more potential scanning modes based on an evaluation of the calculated merit function.

In another particular exemplary embodiment, the techniques may be realized as at least one signal embodied in at least one carrier wave for transmitting a computer program of instructions configured to be readable by at least one processor for instructing the at least one processor to execute a computer process for performing the method as recited above.

In yet another particular exemplary embodiment, the techniques may be realized as at least one processor readable carrier for storing a computer program of instructions configured to be readable by at least one processor for instructing the at least one processor to execute a computer process for performing the method as recited above.

In another particular exemplary embodiment, the techniques may be realized as an apparatus for improving ion implantation. The apparatus may comprise a processor unit in communication with a beam scan controller of an ion implanter, wherein the beam scan controller is configured to cause an ion beam to scan across a wafer. The apparatus may also comprise a measurement interface coupled to the processor unit and the ion implanter. The processor unit may be adapted to: obtain angle-related information associated with the ion beam for a plurality of locations on the wafer, calculate, based on the angle-related information, an ion beam angle distribution for one or more potential scanning modes, and select a desired scanning mode from the one or more potential scanning modes based on an evaluation of performance metric caused by the ion beam angle distribution.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

FIGS. 2a and 2b illustrate exemplary wafer-to-wafer angle variations.

FIGS. 5a and 5b illustrate a shadowing effect caused by ion beam angle variations.

DETAILED DESCRIPTION OF EXEMPLARY EMBODIMENTS

Embodiments of the present disclosure are directed to a technique for improving ion implantation, wherein angle-related information associated with an ion beam is used as an input to predict performance metric resulting from one or more scanning modes. Based on the prediction, a desired scanning mode that results in a desired effective angle distribution across the wafer may be selected for an ion implantation production.

Figures 1A, 1B:
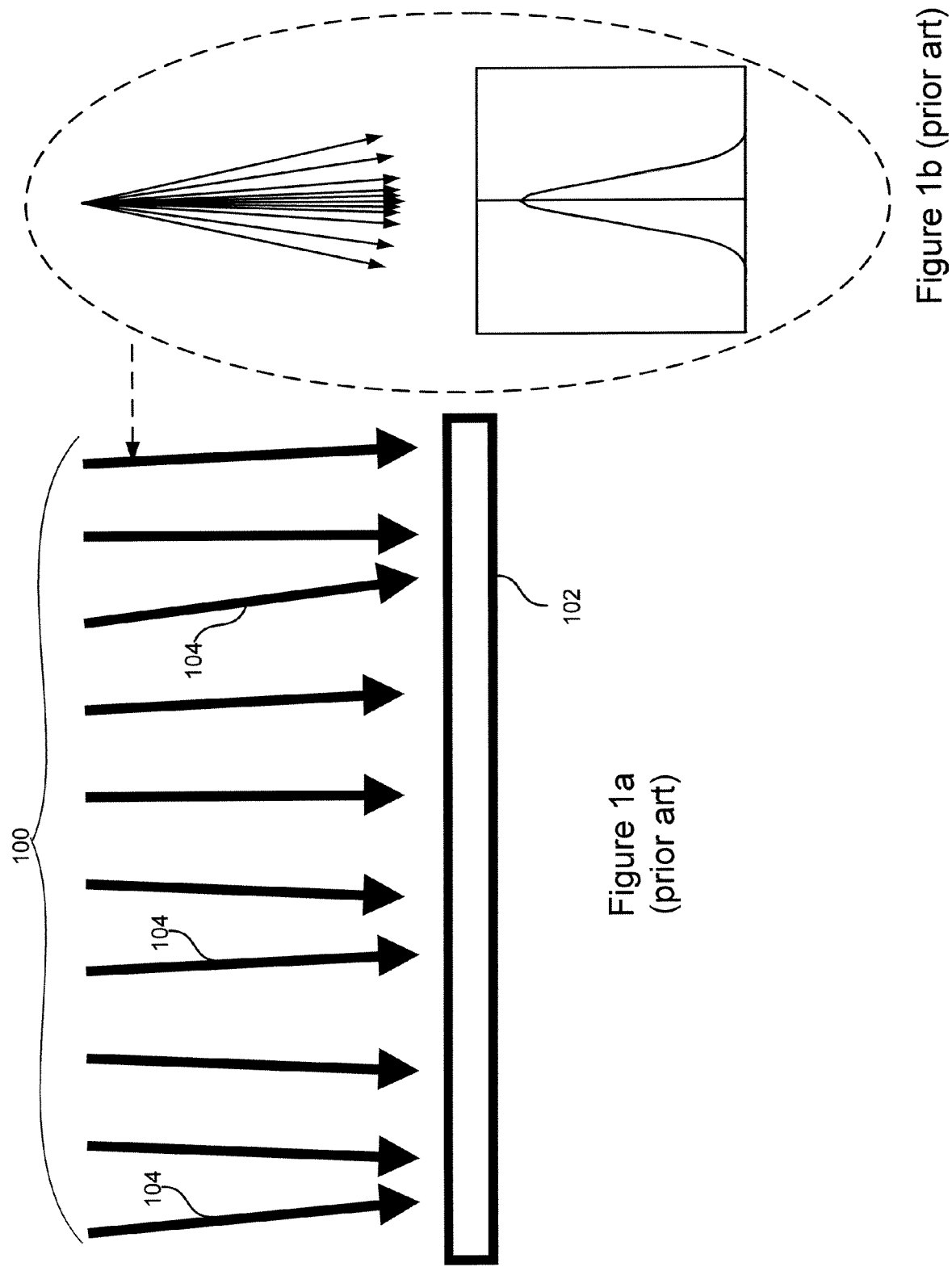
FIGS. 1a and 1b illustrate intrinsic angle spreads for a ribbon-shaped beam and beamlets.
Figure 3:
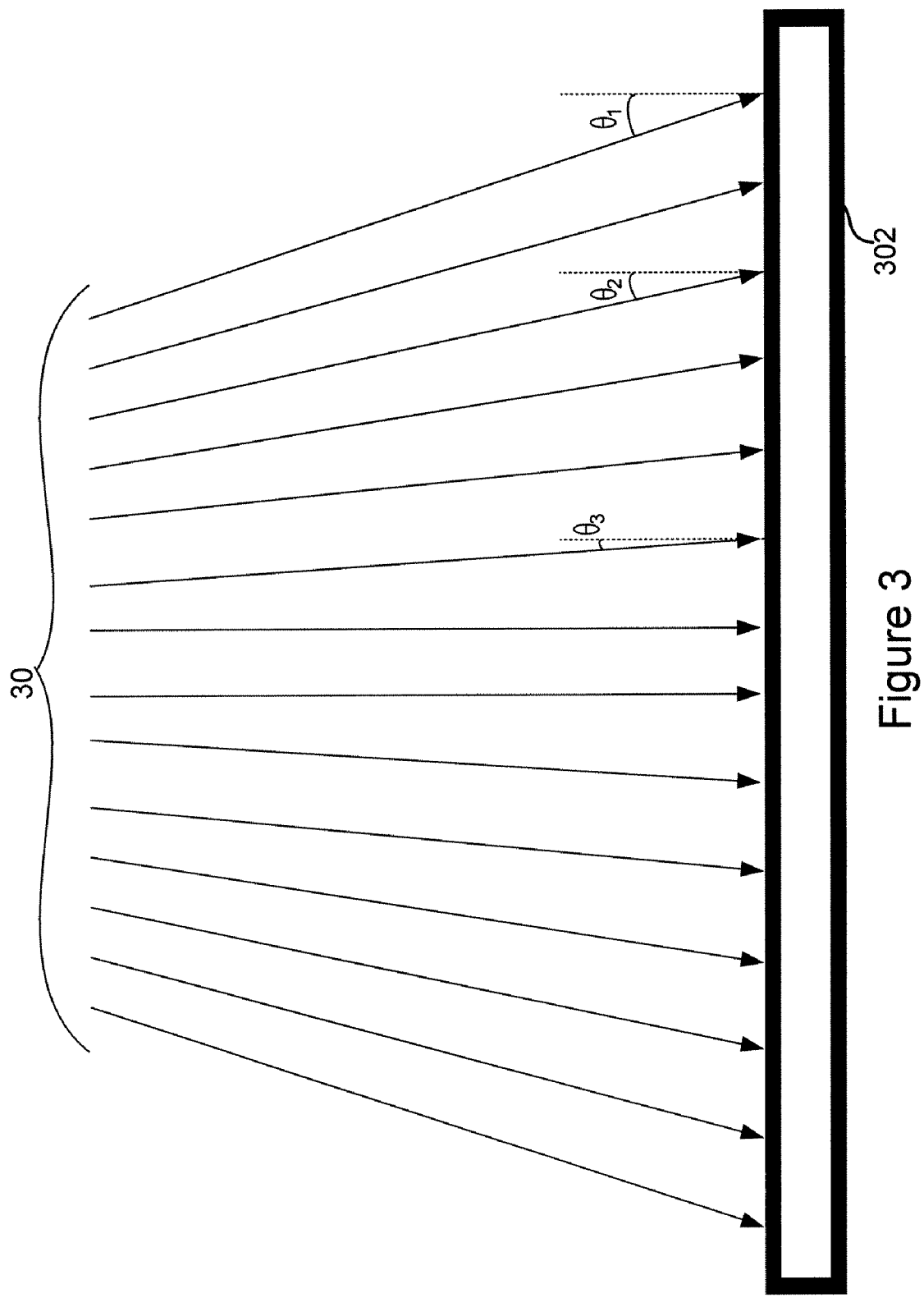
FIG. 3 illustrates exemplary intra-wafer angle variations.
Figure 4:
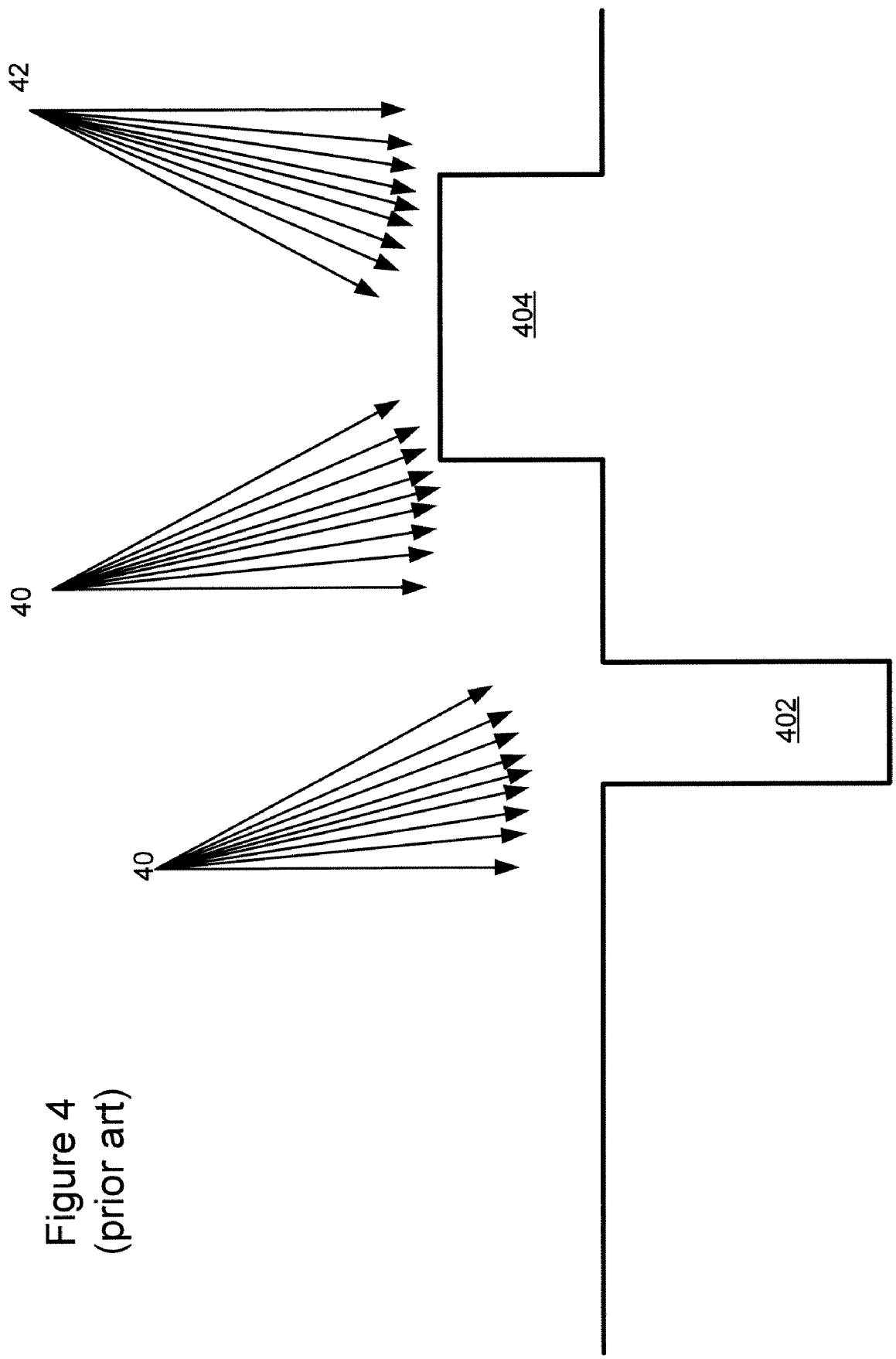
FIG. 4 illustrates exemplary device-level angle variations.
Figure 5A:
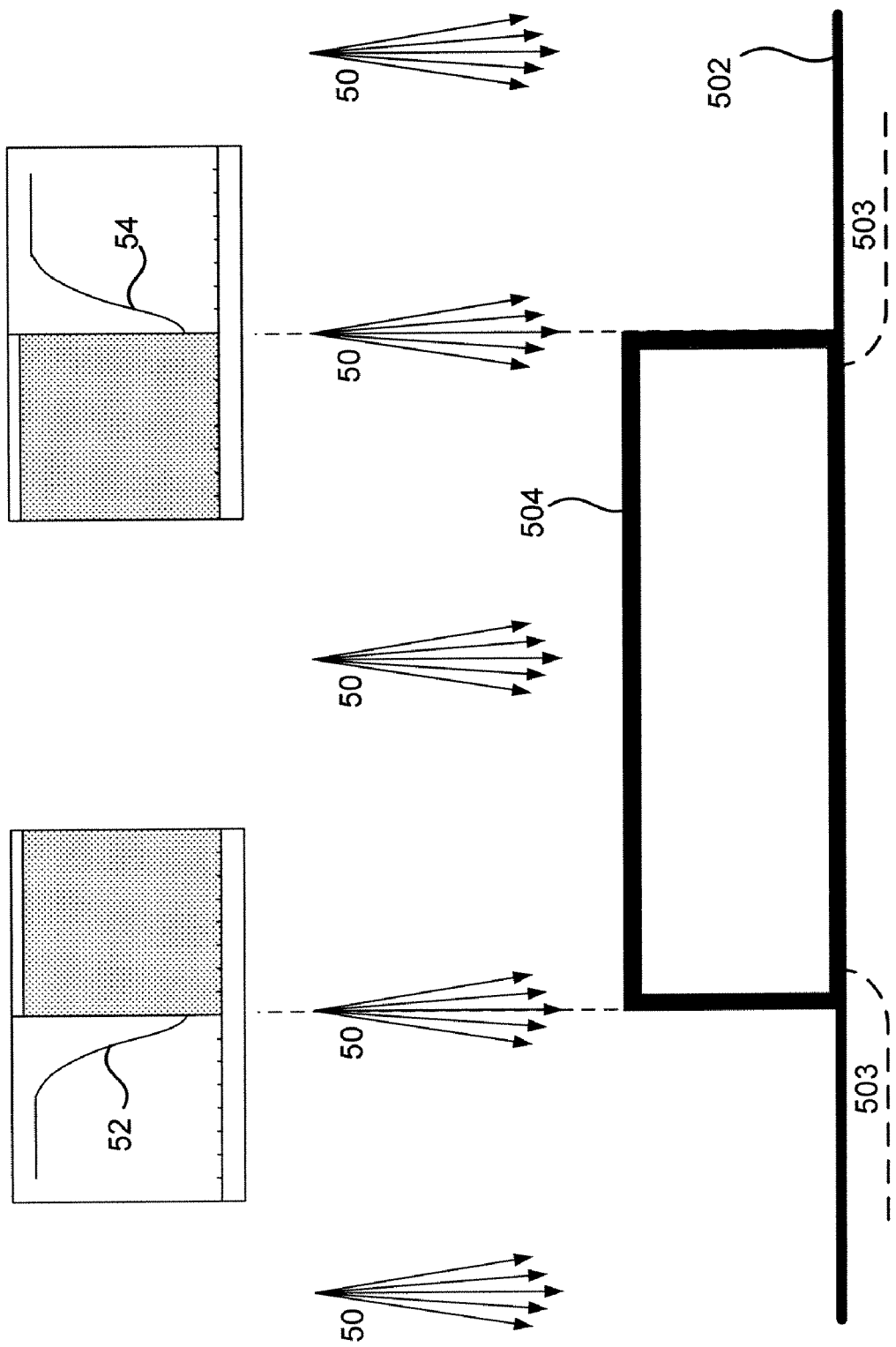
Figure 6:
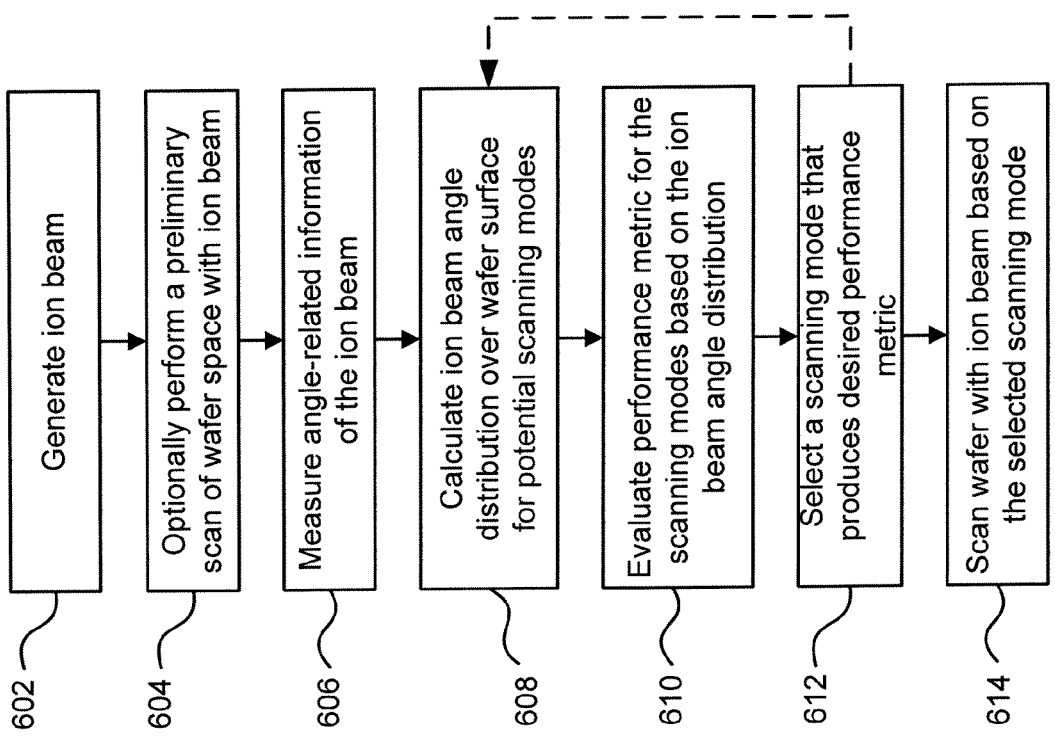
FIG. 6 shows a flowchart illustrating an exemplary method for improving ion implantation based on ion beam angle-related information in accordance with an embodiment of the present disclosure.

Referring to FIG. 6, there is shown a flowchart illustrating an exemplary method for improving ion implantation based on ion beam angle-related information in accordance with an embodiment of the present disclosure.

In step 602, an ion beam may be generated in an ion implanter. The ion beam may be, for example, a ribbon beam or a spot beam. No matter what shape of cross section the ion beam has, the method for controlling its angle distribution as described below may be substantially the same. The generated ion beam may be set up (e.g., tuned and shaped) to be in substantially the same condition as it would be in a subsequent ion implantation production.

In step 604, a preliminary scan of the ion beam may be optionally performed. If the generated ion beam is a ribbon beam, the preliminary scan may not be necessary. If the generated ion beam is a spot beam, especially a low-energy ion beam, the preliminary scan may be performed by sweeping the spot beam according to a beam scan velocity profile to form a ribbon-beam-like scan path.

In step 606, angle-related information associated with the ion beam may be measured and/or calculated. The measurement may be done with one or more measurement devices that may be positioned in or near a wafer plane along a region of interest (ROI). The ROI may, for example, span the width of a ribbon beam or that of a scan path of a spot beam. The angle-related information associated with the ion beam may include an average incident angle (or tilt angle) and an angle spread (or beamlet spread) at each of a plurality of locations along the ROI. The angle spread may be represented with a standard deviation of incident angles at a particular location. According to one embodiment, the angle-related information associated with a scanned spot beam may be calculated based on measurement of a stationary spot beam. An intrinsic angle distribution profile may be measured for the stationary spot beam in horizontal and/or vertical directions using an emittance monitor. The emittance monitor may take one of many forms, as known by one skilled in the art, such as a Faraday cup that scans behind an aperture, i.e., a high aspect ratio Faraday that measures an intensity profile as it is scanned at different angular orientations to the ion beam. The intrinsic angle distribution profile may then be used to calculate angle-related information associated with the scanned spot beam based on the beam scan velocity profile.

In step 608, an ion beam angle distribution may be calculated for each of a plurality of scanning modes. That is, based on the angle-related information obtained in step 606 above, it may be predicted as to what kind of ion beam angle distribution will result from these potential scanning modes.

Figure 9:
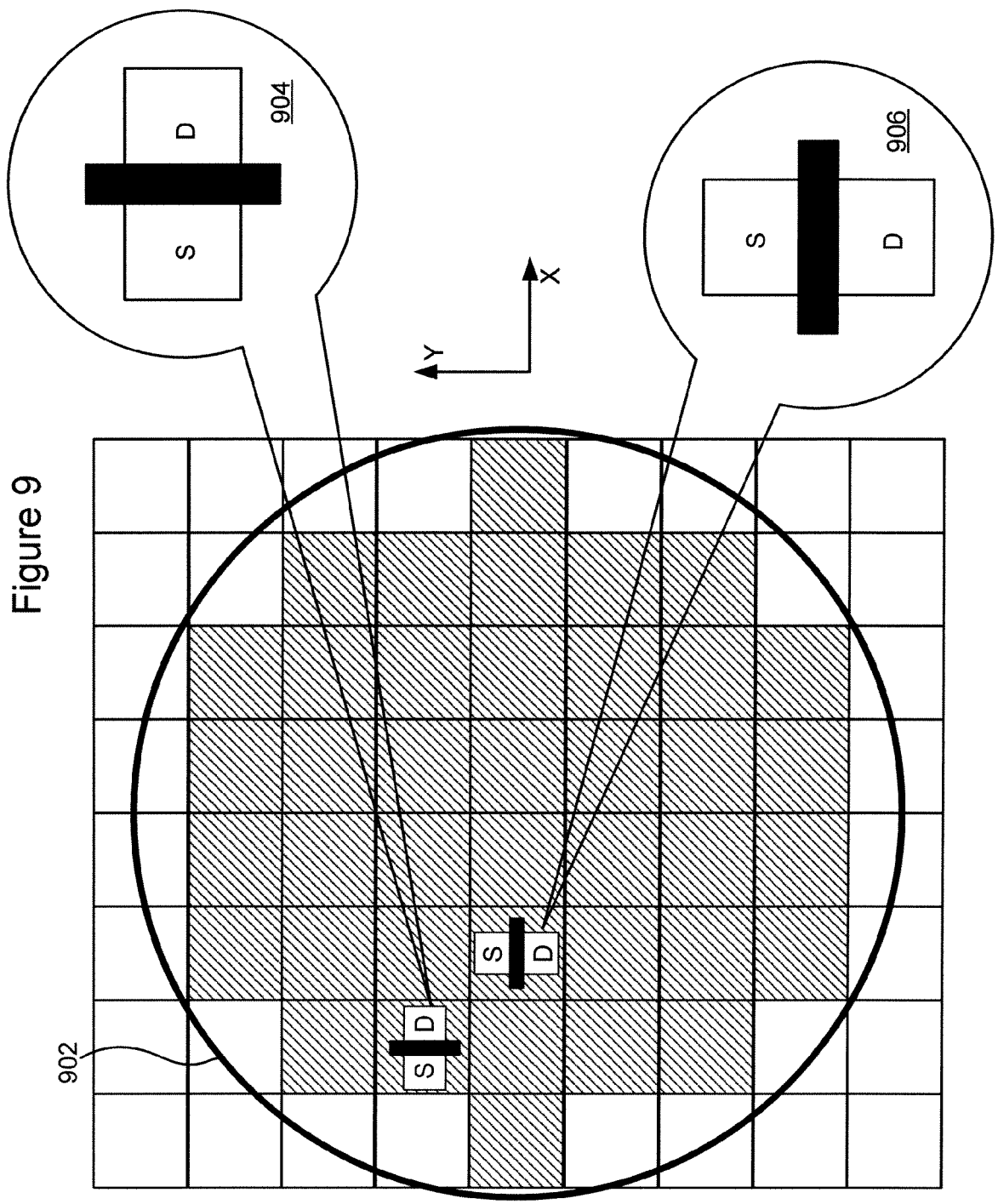
FIG. 9 shows a grid of locations on a wafer for calculating ion beam angle distribution in accordance with an embodiment of the present disclosure.

An "ion beam angle distribution" refers to a range of ion beam incident angles seen by any location on a wafer in a corresponding scanning mode, although, in practice, the angle distribution data may be provided for only a finite number of locations. It is desirable that the finite number of locations are representative of various portions of a wafer. These locations may be chosen, for example, by overlaying a two-dimensional (2-D) grid on the wafer plane. FIG. 9 shows an exemplary 2-D grid on a wafer 902, wherein the shaded blocks may or may not correspond to different dies or chips on a production wafer. The plurality of locations do not have to be evenly spaced as shown in FIG. 9. The angle distribution information for other locations on the wafer may be interpolated or extrapolated from the angle distribution at the finite number of locations. According to one embodiment, for each particular location on the wafer, the ion beam angle distribution may be defined or quantified as a fraction or percentage of an effective beam current (or ion dose) at any incident angle.

A "scanning mode" refers to specific patterns and/or parameters associated with the movement (e.g., rotation, stepping and/or translation) of the wafer through a stationary or scanned ion beam. For example, the wafer may be scanned through an ion beam in one or more passes at a given rotational orientation to complete one step of ion implantation. The wafer may then be rotated relative to the first orientation setting and may be scanned through the ion beam again to complete a second step. The number of such rotations involved may determine the scanning mode. According to one embodiment, the potential scanning modes may include, but are not limited to: a single-step mode involving no rotation (or one orientation setting) of the wafer, a bi-mode involving two rotations of the wafer (e.g., 180° rotations), and a quad-mode involving four rotations of the wafer (e.g., 90° rotations). The scanning modes however are not limited to those listed herein and may comprise of N number of steps with N different orientations of the wafer through each step. In addition to having different orientations of the wafer, the wafer may itself be tilted with respect to the beam direction, through different steps. Other potential scanning modes, such as 2-D mechanical scan, may include different or additional scanning parameters such as, for example, a scan pitch and tilt angles.

In step 610, performance metric may be evaluated for the potential scanning modes based on the respective ion beam angle distributions calculated in step 608. The performance metric may include dose skews and/or angle skews, which are typically calculated based at least in part on device topography such as, for example, aspect ratios of trenches and/or mesas. The performance metric may also include device specific characteristics such as, for example, contact resistance, series resistance, threshold voltage, overlap capacitance, on current, off current, and gate leakage current. One or more merit functions may be calculated to further quantify and evaluate the dose skews, angle skews, and/or device specific characteristics. Calculation of the merit functions may need to take into consideration variations in device topography on different parts of the wafer. The merit functions may include or consider, for example, maximum skews, total or average skews, and standard deviation of skews for dose skews and/or angle skews. The merit functions may also differentiate dose and/or angle skews in different directions, such as X-direction or horizontal skews versus Y-direction or vertical skews. According to one embodiment, the dose and/or angle skews for different locations may be weighted to reflect different local sensitivities to ion beam angle variations. FIG. 9 shows a first transistor 904 with a gate aligned in the vertical (Y) direction and a second transistor 906 with a gate aligned in the horizontal (X) direction. While the first transistor 904 may be more sensitive to horizontal dose or angle skews, the second transistor 906 may be more sensitive to vertical dose or angle skews. Depending on the locations and integration densities of these two types of transistors, it may be desirable to account for their differences with different merit functions or with different weights in a single merit function.

In step 612, a desired scanning mode that produces desired performance metric may be selected. Typically, the selection may be based on a comparison among the merit functions calculated for the potential scanning modes. In addition or alternatively, an upper limit may be imposed for the merit functions, and the merit functions associated with the potential scanning modes may be compared to the upper limit. For example, according to one embodiment, it may be required that the maximum overall skews in ion doses, beam angles and/or other device characteristics be no more than 5-10%. Additional constraints on the scanning modes, such as dose utilization or throughput, may also be factored in during the selection.

It should be noted that steps 608-612 may be repeated, for example, if no acceptable scanning mode is available. In that case, the process may loop back to step 608 where adjustments to the potential scanning modes may be made or new scanning modes may be included for consideration. According to one embodiment of the present disclosure, wafer/beam tilt angles ("tilt offset") of varying degrees may be selectively introduced during different scan passes or steps to help further reduce dose and/or angle skews. Although the tilt angles may increase the asymmetry in ion implantation, it may be compensated for when the wafer is rotated through the different steps. The result may be a net reduction in the overall dose and/or angle skews across the wafer, thus improving the yield from each wafer. At this stage, in addition to scanning modes and tilt offsets or as an alternative, the ion beam may be further tuned (e.g., by adjusting beamline elements) to improve its angular spread such that a chosen scanning method can produce a desired overall ion beam angle distribution.

In step 614, production wafers may be scanned according to the above-selected scanning mode, for example, with the chosen wafer orientations and tilt offsets through each step of the ion implantation.

Figure 7:
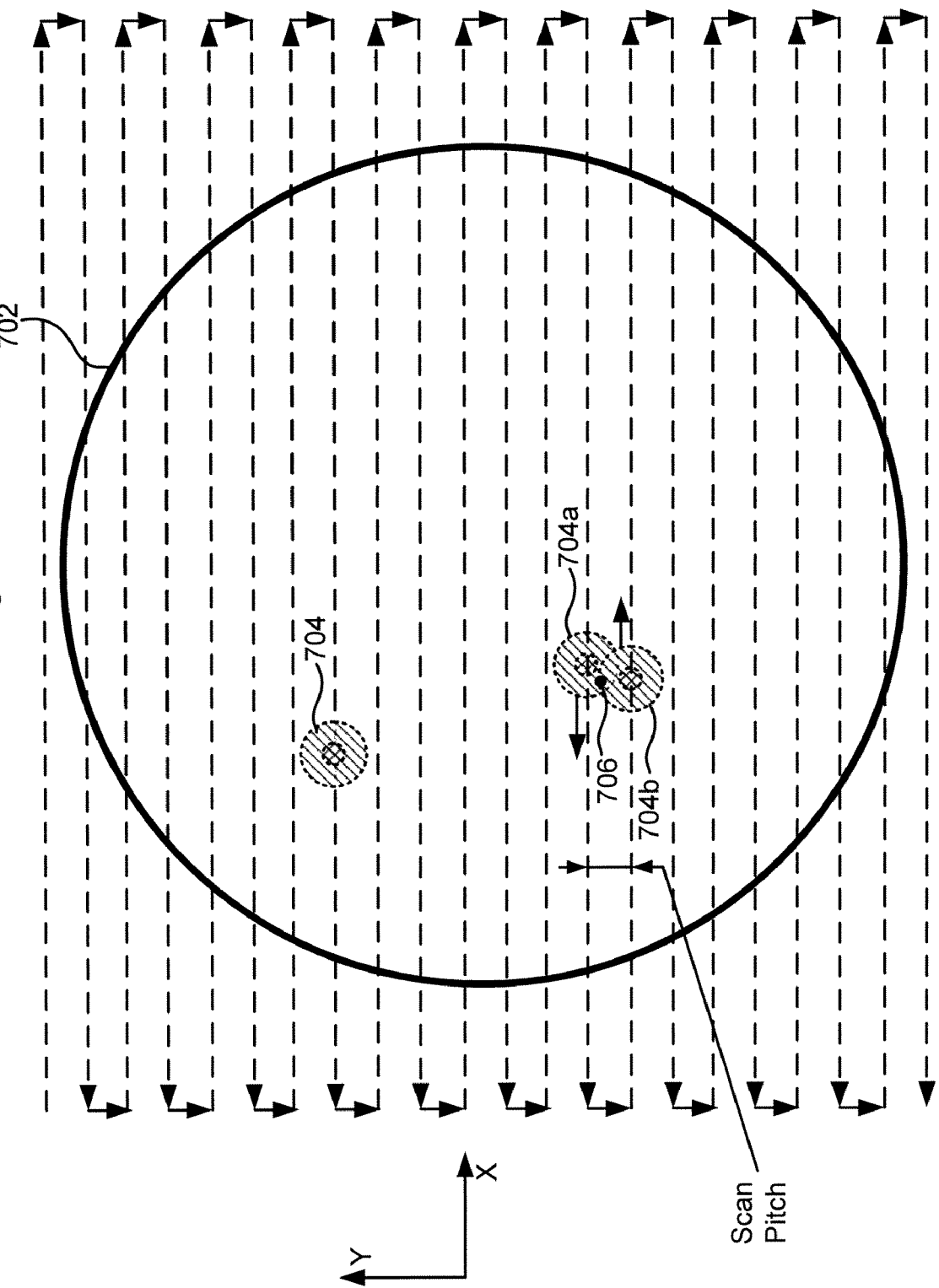
FIG. 7 illustrates an exemplary method for selecting a desired scan pitch for a two-dimensional (2-D) mechanical scan in accordance with an embodiment of the present disclosure.

FIG. 7 illustrates an exemplary method for selecting a desired scan pitch for a two-dimensional (2-D) mechanical scan in accordance with an embodiment of the present disclosure. In a 2-D mechanical scan, a target wafer may be translated with respect to a stationary spot beam that produces a beam spot 704. That is, after each pass in the +X or −X direction, the wafer 702 is translated a small distance, known as a "scan pitch," in the Y direction. The dashed lines in FIG. 7 trace the paths of the beam spot 704 on the wafer 702. Since the intrinsic angle spread of the spot beam may be a Gaussian-like distribution, the ion beam incident angles seen by locations between the dashed lines tend to vary. For example, the ion beam incident angles seen at a point 706 result from an aggregated effect of the beam spot 704a sweeping along one path and the beam spot 704b sweeping along an adjacent path. How much these two opposite-moving beam spots 704a and 704b overlap, which is determined by the scan pitch, may affect angle variations at locations between the two adjacent paths.

According to one embodiment, such angle variations may be controlled or minimized by taking the following steps. First, the intrinsic angle spread within the beam spot 704 may be measured, and/or an angle distribution for a scan path resulting from one sweep of the beam spot 704 may be measured or calculated. Second, an effective angle distribution due to adjacent, overlapping scan paths may be calculated for a varying scan pitch. Third, a desired scan pitch may be selected based on an evaluation of the effective angle distribution. Alternatively, the wafer may be implanted in multiple steps with some tilt offsets to compensate for the variations between the center of the spot and the intermediate regions between the scan paths.

Figure 8:
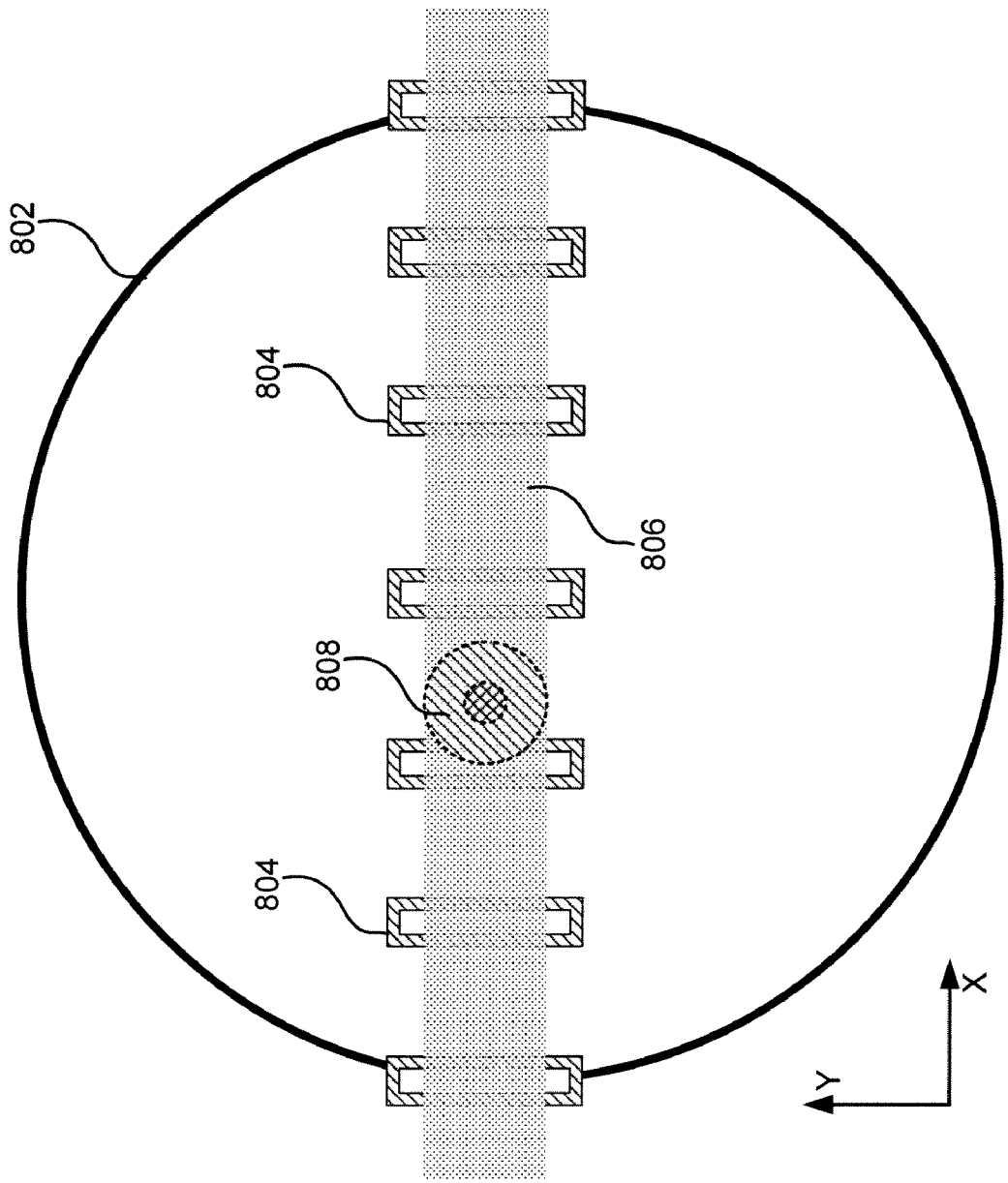
FIG. 8 shows an exemplary setup for obtaining angle-related information associated with an ion beam in accordance with an embodiment of the present disclosure.

FIG. 8 shows an exemplary setup for obtaining angle-related information associated with an ion beam in accordance with an embodiment of the present disclosure. The shadowed area may represent a ribbon beam 806 or a scan path formed by sweeping a spot beam 808. To measure angle-related information associated with the ribbon beam 806 or the spot beam 808 at multiple locations on a wafer 802, a number of measurement devices 804 may be positioned in a horizontal array.

Figure 10:
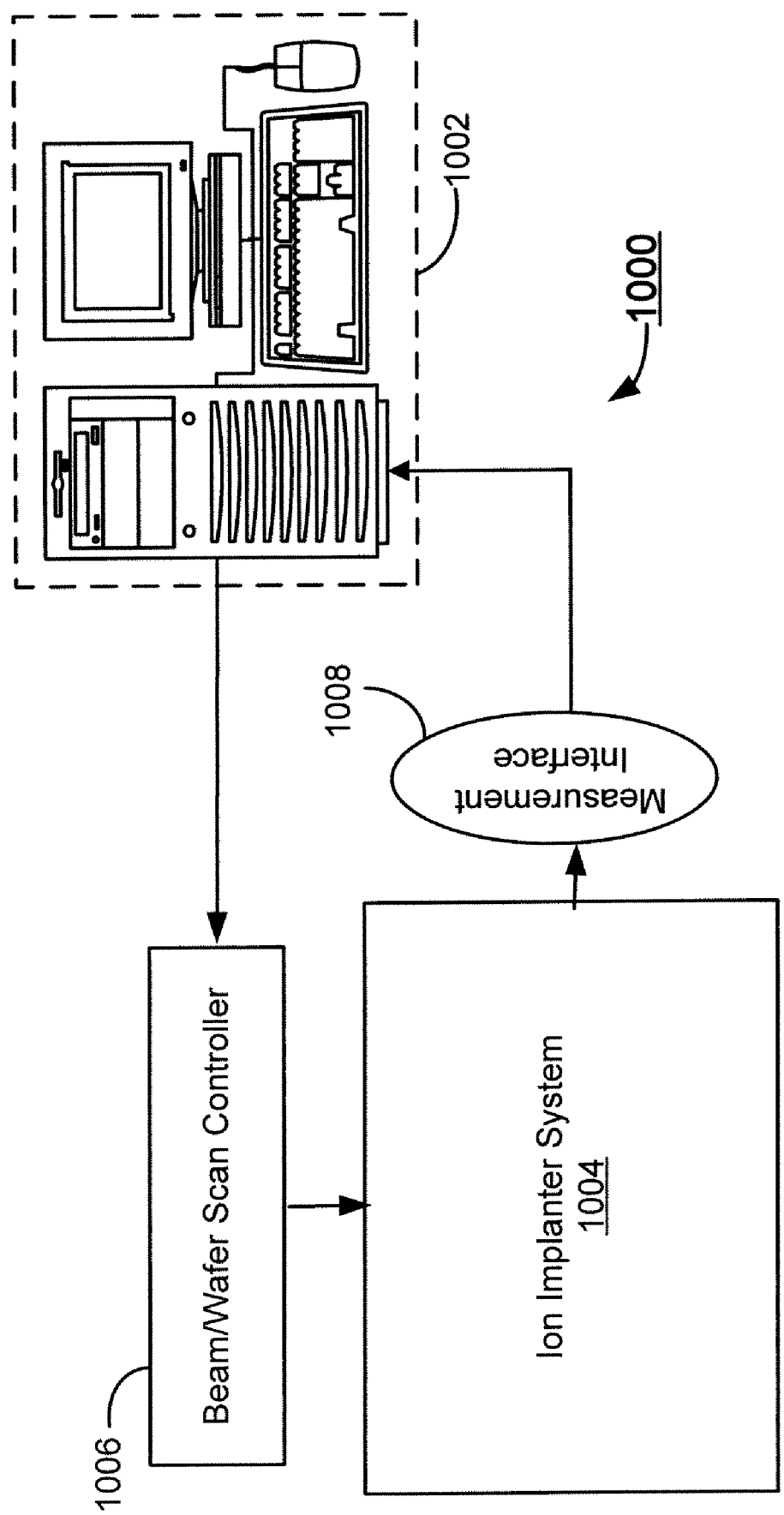
FIG. 10 shows a block diagram illustrating an exemplary system for improving ion implantation based on ion beam angle-related information in accordance with an embodiment of the present disclosure.

FIG. 10 shows a block diagram illustrating an exemplary system 1000 for improving ion implantation based on ion beam angle-related information in accordance with an embodiment of the present disclosure. The system 1000 may comprise a processor unit 1002 which may be a microprocessor, micro-controller, personal computer (PC) or any other processing device. The system 1000 may also comprise a beam/wafer scan controller 1006 that is coupled to an ion implanter system 1004 and may control the scanning of a wafer with an ion beam according to instructions received from the processor unit 1002. The system 1000 may further comprise a measurement interface 1008 through which the processor unit 1002 may receive measurement data from the ion implanter system 1004.

In operation, the processor unit 1002 may cause the beam/wafer scan controller 1006 to initiate a preliminary scan in the ion implanter system 1004, and may receive ion beam angle-related measurements via the measurement interface 1008. The processor unit 1002 may then calculate an ion beam angle distribution based on the angle-related measurement data and select a desired scanning mode based on the ion beam angle distribution.

At this point it should be noted that the technique for improving ion implantation based on ion beam angle-related information in accordance with the present disclosure as described above typically involves the processing of input data and the generation of output data to some extent. This input data processing and output data generation may be implemented in hardware or software. For example, specific electronic components may be employed in an ion implanter or similar or related circuitry for implementing the functions associated with improving ion implantation in accordance with the present disclosure as described above. Alternatively, one or more processors operating in accordance with stored instructions may implement the functions associated with improving ion implantation in accordance with the present disclosure as described above. If such is the case, it is within the scope of the present disclosure that such instructions may be stored on one or more processor readable carriers (e.g., a magnetic disk), or transmitted to one or more processors via one or more signals.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A method for improving ion implantation, the method comprising the steps of:
   obtaining angle-related information associated with an ion beam;

calculating, based on the angle-related information, an ion beam angle distribution over a wafer for one or more potential scanning modes; and selecting a desired scanning mode from the one or more potential scanning modes based on an evaluation of performance metric caused by the ion beam angle distribution.

2. The method according to claim 1, wherein the ion beam is a ribbon beam and at least one of the one or more potential scanning modes involves translating the wafer across the ribbon beam.

3. The method according to claim 1, wherein the ion beam is a spot beam and at least one of the one or more potential scanning modes involves sweeping the spot beam in a first direction and translating the wafer in a second direction perpendicular to the first direction.

4. The method according to claim 3, wherein the angle-related information is obtained by performing a preliminary scan with the spot beam in the first direction and measuring, for each of a plurality of locations along the first direction, a beam angle profile or an ion dose profile associated with the scanned ion beam as seen by that location.

5. The method according to claim 1, wherein the ion beam is a spot beam and at least one of the one or more potential scanning modes involves keeping the spot beam stationary and translating the wafer with respect to the stationary spot beam in a two-dimensional pattern.

6. The method according to claim 1, wherein at least one of the one or more potential scanning modes is a two-dimensional mechanical scanning mode having a specified scan pitch between two consecutive passes, and wherein the selection of the desired scanning mode comprises selecting a desired scan pitch.

7. The method according to claim 1, wherein the plurality of scanning modes are selected from a group consisting of: a single-step mode involving no rotation of the wafer, a bi-mode involving two rotations of the wafer, and a quad-mode involving four rotations of the wafer.

8. The method according to claim 1, further comprising: selecting one or more tilt offsets that, when implemented with the desired scanning mode, produce desired performance metric.

9. The method according to claim 8, wherein each of the one or more tilt offsets is implemented in one scan step in the desired scanning mode.

10. The method according to claim 1, further comprising: tuning an intrinsic angle distribution associated with the ion beam to produce desired performance metric.

11. The method according to claim 1, wherein the evaluation of the performance metric comprises calculating a merit function based on the ion beam angle distribution.

12. The method according to claim 11, wherein the merit function is weighted to account for relative importance of different devices or different portions of the wafer.

13. The method according to claim 1, wherein the performance metric comprises one or more items selected from a group consisting of: dose skews, angle skews, and skews in any device characteristics associated with a plurality of locations on the wafer.

14. The method according to claim 1, wherein the performance metric is based on one or more device specific characteristics or skews therein selected from a group consisting of: contact resistance, series resistance, threshold voltage, overlap capacitance, on current, off current, gate leakage current, or any other device characteristics associated with a plurality of locations on the wafer.

15. The method according to claim 1, wherein the performance metric is calculated based at least in part on device topography associated with a plurality of locations on the wafer.

16. The method according to claim 1, further comprising: calculating, based on the angle-related information, an effective dose distribution of the ion beam for the one or more potential scanning modes; and selecting the desired scanning mode from the one or more potential scanning modes based on an evaluation of dose skews caused by the effective dose distribution.

17. The method according to claim 1, further comprising: calculating, based on the ion beam angle distribution for the one or more potential scanning modes and a substrate topography, a merit function reflecting at least one of an angle and dose effect in one or more regions of the wafer; and selecting a desired scanning mode from the one or more potential scanning modes based on an evaluation of the calculated merit function.

18. At least one signal embodied in at least one carrier wave for transmitting a computer program of instructions configured to be readable by at least one processor for instructing the at least one processor to execute a computer process for performing the method as recited in claim 1.

19. At least one processor readable carrier for storing a computer program of instructions configured to be readable by at least one processor for instructing the at least one processor to execute a computer process for performing the method as recited in claim 1.

20. An apparatus for improving ion implantation, the apparatus comprising:

a processor unit in communication with a beam scan controller of an ion implanter, wherein the beam scan controller is configured to cause an ion beam to scan across a wafer; and a measurement interface coupled to the processor unit and the ion implanter;

wherein the processor unit is adapted to:
obtain angle-related information associated with the ion beam for a plurality of locations on the wafer,
calculate, based on the angle-related information, an ion beam angle distribution for one or more potential scanning modes, and
select a desired scanning mode from the one or more potential scanning modes based on an evaluation of performance metric caused by the ion beam angle distribution.

21. The apparatus according to claim 20, wherein the ion beam is a ribbon beam and at least one of the one or more potential scanning modes involves translating the wafer across the ribbon beam.

22. The apparatus according to claim 20, wherein the ion beam is a spot beam and at least one of the one or more potential scanning modes involves sweeping the spot beam in a first direction and translating the wafer in a second direction perpendicular to the first direction.

23. The apparatus according to claim 22, wherein the angle-related information is obtained by performing a preliminary scan with the spot beam in the first direction and measuring, for each of a plurality of locations along the first direction, a beam angle profile or an ion dose profile associated with the scanned ion beam as seen by that location.

24. The apparatus according to claim 20, wherein the ion beam is a spot beam and at least one of the one or more potential scanning modes involves keeping the spot beam stationary and translating the wafer with respect to the stationary spot beam in a two-dimensional pattern.

25. The apparatus according to claim 20, wherein at least one of the one or more potential scanning modes is a two-dimensional mechanical scanning mode having a specified scan pitch between two consecutive passes, and wherein the selection of the desired scanning mode comprises selecting a desired scan pitch.

26. The apparatus according to claim 20, wherein the plurality of scanning modes are selected from a group consisting of: a single-step mode involving no rotation of the wafer, a bi-mode involving two rotations of the wafer, and a quad-mode involving four rotations of the wafer.

27. The apparatus according to claim 20, wherein the processor unit is further adapted to select one or more tilt offsets that, when implemented with the desired scanning mode, produce desired performance metric.

28. The apparatus according to claim 27, wherein each of the one or more tilt offsets is implemented in one scan step in the desired scanning mode.

29. The apparatus according to claim 20, wherein the processor unit is further adapted to tune an intrinsic angle distribution associated with the ion beam to produce desired performance metric.

30. The apparatus according to claim 20, wherein the evaluation of the performance metric comprises calculating a merit function based on the ion beam angle distribution.

31. The apparatus according to claim 20, wherein the performance metric comprises one or more items selected from a group consisting of: dose skews, angle skews, and skews in any device characteristics associated with a plurality of locations on the wafer.

32. The apparatus according to claim 20, wherein the performance metric is based on one or more device specific characteristics or skews therein selected from a group consisting of: contact resistance, series resistance, threshold voltage, overlap capacitance, on current, off current, gate leakage current, or any other device characteristics associated with a plurality of locations on the wafer.

33. The apparatus according to claim 20, wherein the performance metric is calculated based at least in part on device topography associated with a plurality of locations on the wafer.

34. The apparatus according to claim 20, wherein the processor unit is further adapted to:
calculate, based on the angle-related information, an effective dose distribution of the ion beam for the one or more potential scanning modes; and
select the desired scanning mode from the one or more potential scanning modes based on an evaluation of dose skews caused by the effective dose distribution.

35. The apparatus according to claim 20, wherein the processor unit is further adapted to:
calculate, based on the ion beam angle distribution for the one or more potential scanning modes and a substrate topography, a merit function reflecting at least one of an angle and dose effect in one or more regions of the wafer; and
select a desired scanning mode from the for one or more potential scanning modes based on an evaluation of the calculated merit function.

* * * * *